United States Patent [19]

Mizutani et al.

[11] 4,367,369
[45] Jan. 4, 1983

[54] SOLAR BATTERY

[75] Inventors: Fumio Mizutani, Ibaragi; Masahiko Yoshiura, Tokyo; Keiji Iriyama, Ibaragi; Kanji Sasaki, Ibaragi; Keishiro Tsuda, Ibaragi, all of Japan

[73] Assignees: Agency of Industrial Science & Technology, Tokyo; Ministry of International Trade & Industry, both of Japan

[21] Appl. No.: 244,908

[22] Filed: Mar. 18, 1981

[30] Foreign Application Priority Data

Mar. 29, 1980 [JP] Japan .................................. 55-40956

[51] Int. Cl.$^3$ ................................................ H01L 31/06
[52] U.S. Cl. ........................... 136/263; 136/261; 357/30; 357/8
[58] Field of Search .............. 136/263, 261; 357/8, 357/30 B, 30 J, 30 K

[56] References Cited

U.S. PATENT DOCUMENTS 4,106,951 8/1978 Masi ........................... 136/263
4,127,738 11/1978 Ghosh et al. ................ 136/255

FOREIGN PATENT DOCUMENTS 55-154780 12/1980 Japan .................................. 136/263

OTHER PUBLICATIONS

K. Kudo et al., "Photovoltaic Effects of Merocyanine-ZnO Cells", *Japanese J. Appl. Phys.*, vol. 19, No. 11 (Nov. 1980), pp. L683–L685.
H. Meier et al., "Zum Problem der pn-Übergänge Zwischen Organischen und Anorganischen Photoleitem", *Ber. Bunsenges Physik Chem.*, vol. 69 (2), pp. 160–167, (1965).
M. Ozaki et al., "Semiconductor Properties of Polyacetylene p-(CH)$_x$:n-CdS Heterojunctions", *J. Appl. Phys.*, vol. 51, pp. 4252–4256 (1980).

*Primary Examiner*—Aaron Weisstuch
*Attorney, Agent, or Firm*—Oblon, Fisher, Spivak, McClelland & Maier

[57] ABSTRACT

A solar battery is formed by forming a film of a specific merocyanine dye on an n-type semiconductor substrate thereby producing a p-n junction in the interface between the dye film and the semiconductor substrate and connecting electrodes one each to the two layers.

6 Claims, 1 Drawing Figure

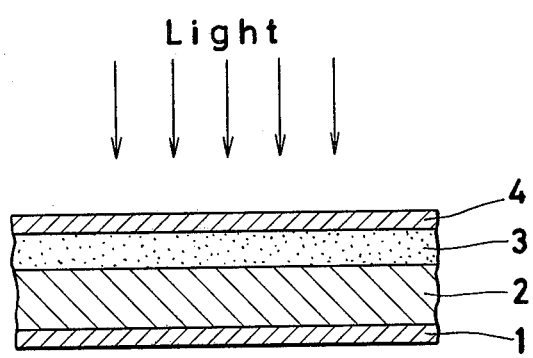

SOLAR BATTERY

BACKGROUND OF THE INVENTION

This invention relates to a solar battery which consists of a p-n junction type semiconductor having a merocyanine dye film formed on an n-type semiconductor substrate.

The solar battery which converts the energy radiated by the sun, a literally infinite energy source, into electrical energy awakens great expectations, and its development is pursued in various fields. To date, a silicon solar battery, GaAs solar battery, CdTe solar battery, CdS solar battery, etc. have been proposed. Some of these solar batteries have been already reduced to practical use.

Some of the inventors involved in this invention participated in the recent proposal of Al/merocyanine dye film/Ag sandwich cells (Japanese Journal of Appl. Phys., Vol. 19-supplement 2 (1980), pp 173–177). The sandwich cells have a restriction that their manufacture should take place under a high degree of vacuum. This disadvantage, coupled with their relatively short service life, has rendered their actual commercialization hardly feasible.

SUMMARY OF THE INVENTION

An object of this invention is to provide a solar battery which promises easy manufacture, abounds in efficiency of solar energy absorption and efficiency of energy conversion and enjoys a long service life.

To accomplish the object described above according to the present invention, there is provided a solar battery which consists of a p-n junction type semiconductor having a specific merocyanine dye film formed on an n-type semiconductor substrate, with electrodes connected one each to the n-type semiconductor and the merocyanine dye film.

When the merocyanine dye film is formed on the n-type semiconductor as described above, a p-n junction is produced in the interface. The p-n junction, on exposure to a light, generates an electric current.

The solar battery of the present invention is obtained by simply forming a merocyanine dye film on an n-type semiconductor substrate and connecting electrodes one each to the layers. Thus, it permits mass production. The manufacture of this solar battery is easy because it is not required to proceed under a vacuum of high degree.

The other objects and characteristics of this invention will become apparent from the further disclosure of the invention to be made herein below with reference to the accompanying drawing.

BRIEF DESCRIPTION OF THE DRAWING

The drawing represents a sectioned view of a typical solar battery provided by the present invention.

DESCRIPTION OF THE PREFERRED EMBODIMENTS

The inventors continued a diligent study with a view to developing a solar battery possessed of a high energy conversion efficiency and a long service life by using a p-n junction type semiconductor which has a high efficiency for solar energy absorption and which can be manufactured simply and inexpensively. They have consequently found that when a specific merocyanine dye, a substance heretofore known to behave like a p-type semiconductor, is deposited in the form of a film on an n-type semiconductor substrate, a p-n junction capable of exhibiting an excellent effect of solar battery is formed along the interface between the two layers. This discovery has led to perfection of the present invention.

Specifically, this invention relates to a solar battery which comprises a p-n junction type semiconductor having a merocyanine dye of the general formula:

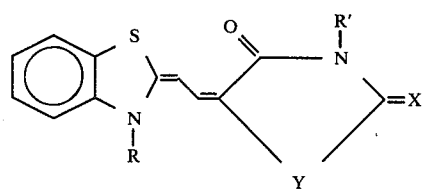

[wherein, R denotes a linear alkyl group having 1 to 20 carbon atoms, R' a linear alkyl group having 1 to 20 carbon atoms or a group of the formula, $-(CH_2)_n-COOH.Z$ (where, n is an integer having the value of 1 to 4 and Z denotes an amine), and X and Y each denote an oxygen atom or sulfur atom] deposited in the form of a film on an n-type semiconductor substrate, and electrodes connected one each to the merocyanine dye film part and the n-type semiconductor substrate part of the p-n junction type semiconductor.

In the aforementioned general formula which represents the merocyanine dye to be used in the present invention, the substituent R is required to be a linear alkyl group having 1 to 20 carbon atoms. Otherwise, the objects of the present invention cannot be fulfilled. The substituent R' is a linear alkyl group having 1 to 20 carbon atoms or a carboxyl group, 1'-carboxymethyl group, 2'-carboxyethyl group, 3'-carboxypropyl group or an amine adduct of 4'-carboxybutyl group. The substituents X and Y each denote an oxygen atom, sulfate atom, or selenium atom and may be identical to or different from each other.

Many merocyanine dyes have been known to serve as sensitizers for silver-salt photography, and they are easily synthesized and, therefore, fit mass production. The merocyanine dye which satisfies the aforementioned general formula on condition that R is an ethyl group and R' is an amine adduct of carboxymethyl group, for example, is obtained by heating 2-methyl-3-ethyl-benzothiazolium-p-chlorobenzene sulfonic acid and 5-acetylanilide-methylene-3-carboxymethyl rhodanine in ethanol in the presence of an amine as a condensing agent.

No specific limitation is imposed on the n-type semiconductor to be used in the present invention. Examples of n-type semiconductors which are advantageously usable herein include a single-crystal silicon n-type semiconductor, amorphous silicon n-type semiconductor and single-crystal germanium n-type semiconductor.

The p-n junction type semiconductor for the solar battery of this invention is obtained by covering the whole or part of one surface of the n-type semiconductor substrate with a film of the aforementioned merocyanine dye by the vacuum evaporation method, spray method, solvent expulsion method, Blodgett method, etc. The manufacture of the p-n junction type semiconductor described above can be effected by using any of the known methods in its unmodified form. No special technical requirements such as creation of a high degree of vacuum are involved.

The dye film to be formed on the n-type semiconductor substrate fulfills its function sufficiently with a thickness falling within the range of from 80 Å to 300 Å.

No specific limitation is fixed with respect to the shape of the n-type semiconductor substrate to be used in this case. It is nevertheless advantageous that this substrate should be used in the shape of a plate or corrugated sheet having a large area available for collecting the impinging sunlight. Provision of electrodes for the merocyanine dye film part and the n-type semiconductor substrate part respectively of the p-n junction type semiconductor produced as described above completes the solar battery aimed at by the present invention.

The electrodes for the solar battery of this invention are formed by wholly or partly covering the surfaces of the dye film part and the semiconductor substrate part with a conductor such as of a metal substance or by depositing this conductor in the form of dispersed dots on the surfaces. When the electrodes are formed so as to cover the surfaces wholly or substantially wholly, the electrode on the merocyanine dye film side is required to be pervious to light. The electrode thus pervious to light can be obtained by forming a metal film such as of gold or silver by the vacuum deposition method.

Now, a typical example of the solar battery of this invention will be described with reference to the accompanying drawing. A merocyanine dye film 3 is formed on a plate-shaped n-type semiconductor substrate 2. A metal film electrode 1 is formed on the lower surface of the semiconductor substrate 2 and a metal film electrode 4 pervious to light is formed on the upper surface of the dye film 3. Methods for manufacturing the solar battery will be specifically described. The vacuum deposition method, for example, involves first depositing a metal on the one surface of the n-type semiconductor substrate 2 under a vacuum of the degree of about $10^{-5}$ mmHg to produce an electrode 1, then forming a merocyanine dye film 3 on the other surface of the substrate 2, and thereafter depositing a translucent metal film on the upper surface of the merocyanine dye film 3 by the same technique of vacuum deposition as described above to form an electrode 4. If the merocyanine dye to be used is of a type such that the substituent R or R' in the aforementioned general formula has a large number of carbon atoms, the vacuum deposition of this dye must be carried out under a vacuum of very high degree. In this case, therefore, the deposition of the merocyanine dye film on the substrate is desired to be performed by the spray method, solvent expulsion method or blow jet method.

When the solar battery manufactured as described above is exposed to the sun so that the sunlight irradiates the merocyanine dye film thereof, the electrons in the dye film flow toward the n-type zone and the holes in the semiconductor flow toward the p-type zone. The amounts of the electrons and the holes which are liberated during the irradiation of the dye film are substantially proportional to the amount of the sunlight impinging upon the dye film. The efficiency of energy conversion remains substantially intact when the sunlight being utilized has a wavelength within the range of from 400 nm to 600 nm. The solar battery of this invention, therefore, enjoys an ample allowance for the range of wavelength of the sunlight and a high efficiency of energy conversion.

As is clear from the description given above, this invention produces the solar battery by depositing a film of a specific merocyanine dye on the surface of an n-type semiconductor substrate thereby forming a p-n junction ideal for the function of a solar battery in the interface of the substrate and the dye film and then providing electrodes for the semiconductor substrate and the dye film respectively. The manufacture of the solar battery of this invention is easy, because the solar battery is produced without use of any advanced vacuum technique. Since the dye film absorbs the visible light in a wide range of wavelengths, the efficiency of solar energy absorption is high and the efficiency of energy conversion is as high as about 1.9%. The solar battery, therefore, is sufficiently feasible.

Now, working examples of this invention will be described.

EXAMPLE 1

A film, 100 Å in thickness, of a merocyanine dye represented by the formula:

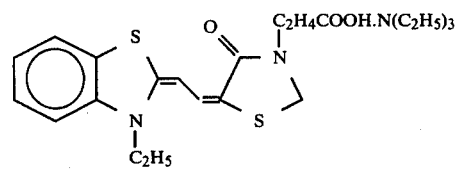

was formed by the vacuum deposition method on one surface of an n-type semiconductor substrate of single-crystal silicon (15 mm × 40 mm) which had an indium electrode formed in advance by the vacuum deposition method on the remaining surface thereof. On the outer surface of the merocyanine dye film, a translucent silver electrode was formed by the same method as described above.

The solar battery thus obtained was exposed to monochromic light having a wavelength of 530 nm and an intensity of 4.5 W/cm² so that the light irradiated the merocyanine dye film side of the battery continuously for 8 hours. The electric current flowing through a closed circuit was measured. The current was found to remain constant at a level of 0.15 mA/cm². The open-circuit voltage was 0.45 V, the fill factor 0.4, and the light transmittance of the translucent silver electrode about 30%, indicating that the efficiency of energy conversion was about 1.9%.

Alternate steps of 8 hour irradiation of the solar battery with the monochromic light and 16 hour keeping of the irradiated solar battery in a dark room were taken three times and then the solar battery was tested for current and voltage, with the result that little variation could be found.

The solar battery was further exposed to sunlight with an intensity of 30 W/cm² and, as a result, it exhibited an open-circuit voltage of 0.50 V, a short-circuit current of 0.88 mA/cm², a fill factor of 0.4 and a light transmittance of about 30%, indicating that the efficiency of energy conversion was about 1.2%.

EXAMPLE 2

A film, 100 Å in thickness, of a merocyanine dye represented by the formula:

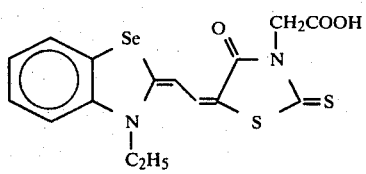

was formed on one surface of an n-type semiconductor substrate of a single-crystal silicon by casting onto the aforementioned surface a chloroform solution having 1 mM of the merocyanine dye dissolved therein and causing the chloroform to evaporate. The substrate had an indium electrode formed by the vacuum deposition method on the remaining surface thereof. On the surface of the merocyanine dye film, a translucent silver electrode was formed by the same method as described above.

The solar battery thus obtained was exposed to a light having a wavelength of 530 nm and an intensity of 4.5 W/cm². As a result, it exhibited an open-circuit voltage of 0.42 V, a short-circuit current of 0.05 mA, a fill factor of 0.35 and a light transmittance of about 30%, indicating that the efficiency of energy conversion was about 0.6%.

What is claimed is:

1. A solar battery, comprising in combination an n-type semiconductor substrate, an overlying film of a merocyanine dye forming a p-n photoactive junction therewith, said dye being represented by the general formula:

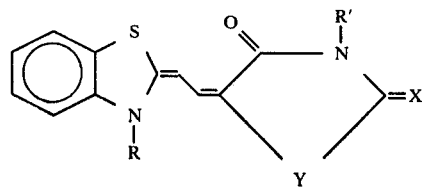

wherein, R denotes a linear alkyl group having 1 to 20 carbon atoms, R' a linear alkyl group having 1 to 20 carbon atoms or a group of the formula, —(CH$_2$)$_n$-.COOH.Z (where, n is an integer having the value of 1 to 4 and Z is an amine), and X and Y each denote an oxygen atom or sulfur atom, a first electrode electrically connected to said n-type semiconductor, and a second electrode electrically connected to said merocyanine dye film.

2. The solar battery according to claim 1, wherein the merocyanine dye film formed on the n-type semiconductor has a thickness within the range of from 80 Å to 300 Å.

3. The solar battery according to claim 1, wherein the second electrode is formed of a metal film pervious to light.

4. The solar battery according to claim 3, wherein the second electrode is a silver film.

5. The solar battery according to claim 1, wherein said merocyanine dye is represented by the following formula:

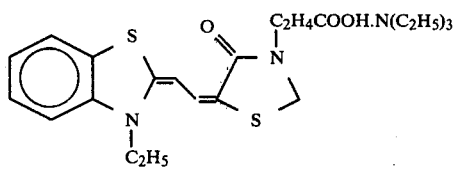

6. The solar battery according to claim 1, wherein said n-type semiconductor substrate is an n-type silicon substrate.

* * * * *